United States Patent
Choi et al.

(10) Patent No.: US 8,922,465 B2
(45) Date of Patent: Dec. 30, 2014

(54) ORGANIC ELECTRO LUMINESCENCE DISPLAY

(71) Applicant: Samsung Display Co., Ltd., Yongin, Gyeonggi-do (KR)

(72) Inventors: Sang Moo Choi, Yongin (KR); JinKoo Chung, Suwon (KR); Junho Choi, Yongin (KR); Seong-Min Kim, Anyang (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 43 days.

(21) Appl. No.: 13/666,374

(22) Filed: Nov. 1, 2012

(65) Prior Publication Data

US 2013/0113774 A1    May 9, 2013

(30) Foreign Application Priority Data

Nov. 3, 2011    (KR) .......................... 10-2011-0114093

(51) Int. Cl.
*G09G 3/30*    (2006.01)

(52) U.S. Cl.
USPC ......................................... 345/76; 315/169.3

(58) Field of Classification Search
CPC ............ G09G 2300/0426; G09G 3/32; G09G 3/3233; G09G 2300/0439; G09G 3/3208; G09G 3/36; G09G 2300/0443; G09G 2300/0819; G09G 2300/0852; G09G 2320/0223; G09G 2320/043; G02F 1/1368; G02F 1/134363; G02F 1/1333; G02F 1/1362; G02F 2001/134372; G02F 1/1343; G02F 1/136286; G02F 1/13338; G02F 1/13439; G02F 1/136227

USPC .................. 345/76–84, 87–102, 205–206
See application file for complete search history.

(56) References Cited

U.S. PATENT DOCUMENTS

| 6,602,540 | B2  |   | 8/2003  | Gu et al. |           |
|-----------|-----|---|---------|-----------|-----------|
| 6,794,061 | B2  |   | 9/2004  | Liao et al. |         |
| 8,426,230 | B2  | * | 4/2013  | Lee ................. | 438/34 |
| 8,570,310 | B2  | * | 10/2013 | Huang et al. ......... | 345/206 |
| 2007/0070056 | A1 | * | 3/2007 | Sato et al. ............ | 345/207 |
| 2008/0002123 | A1 | * | 1/2008 | Kim ...................... | 349/139 |
| 2009/0160748 | A1 | * | 6/2009 | Kimura et al. .......... | 345/94 |
| 2010/0188319 | A1 | * | 7/2010 | Taniguchi et al. ...... | 345/80 |
| 2011/0220922 | A1 |   | 9/2011  | Kim et al. |           |
| 2012/0268396 | A1 | * | 10/2012 | Kim et al. .............. | 345/173 |

FOREIGN PATENT DOCUMENTS

| KR | 10-2003-0066370 (A) | 8/2003 |
|----|---------------------|--------|
| KR | 10-0462723 (B1)     | 12/2004 |

* cited by examiner

*Primary Examiner* — Duc Dinh
(74) *Attorney, Agent, or Firm* — Knobbe, Martens, Olson & Bear, LLP

(57) ABSTRACT

An organic electro luminescence display is disclosed. In one embodiment, the display includes a substrate, an organic light emitting diode disposed on the substrate and including a pixel electrode, an organic light emitting layer, and a common electrode, a scan interconnection disposed on the substrate and providing a scan signal to the organic light emitting diode. The display may further include a data interconnection disposed on the substrate and providing a data signal to the organic light emitting diode, and a power interconnection disposed on the substrate and providing a power to the organic light emitting diode. The common electrode has an opening which overlaps with at least a portion of the scan interconnection, the data interconnection, and the power interconnection.

7 Claims, 17 Drawing Sheets

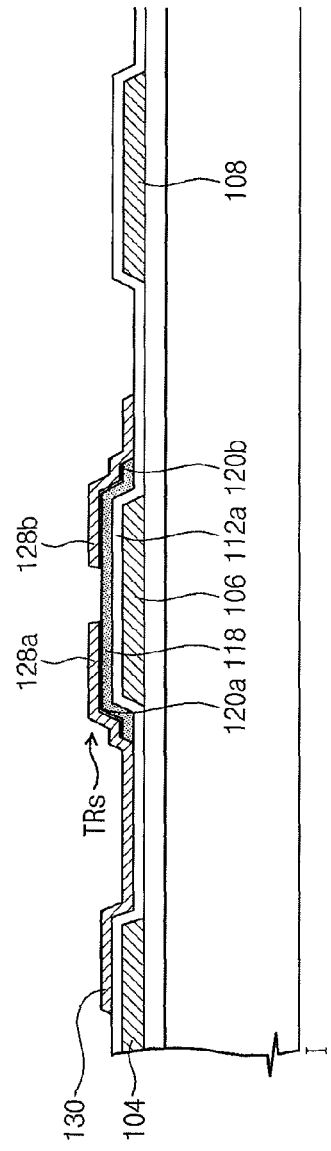
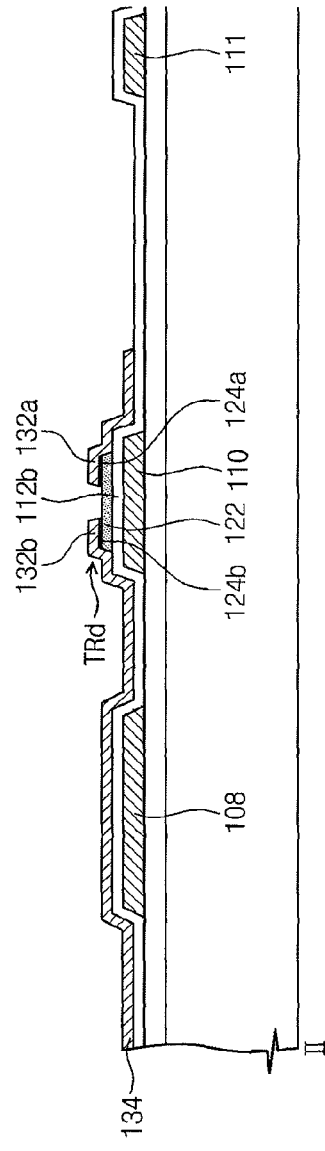

ORGANIC ELECTRO LUMINESCENCE DISPLAY

CROSS-REFERENCE TO RELATED APPLICATIONS

This U.S. non-provisional patent application claims priority under 35 U.S.C. §119 to Korean Patent Application No. 10-2011-0114093, filed on Nov. 3, 2011, the entirety of which is incorporated by reference herein.

BACKGROUND

The described technology generally relates to display devices and, more particularly, to organic electro luminescence displays.

Electrons and holes injected into an organic light emitting layer through a cathode and an anode are recombined to form excitons. Organic electro luminescence displays correspond to display devices using the phenomenon which generate light of predetermined wavelength by energy of the excitons.

The organic electro luminescence displays may be classified into passive driving type-organic electro luminescence displays and active driving type-organic electro luminescence displays according to driving methods. The active driving type-organic electro luminescence display includes two thin film transistors for driving an organic light emitting diode including the organic light emitting layer. That is, the active driving type-organic electro luminescence display includes a driving transistor applying a driving current into the organic light emitting diode, and a switching transistor to turn on/off the driving transistor by transmitting a data signal to the driving transistor. The organic light emitting diode typically includes a pixel electrode, the organic light emitting layer, and a common electrode.

Additionally, the organic electro luminescence display may further include interconnections electrically connected to the driving transistor and the switching transistor. Here, a parasitic capacitance may be generated between the interconnections and the organic light emitting layer that can decrease a driving speed of the organic light emitting layer and increase power consumption.

SUMMARY

One inventive aspect is an organic electro luminescence display with improved driving speed and reduced power consumption.

Another aspect is an organic electro luminescence display which includes: a substrate; an organic light emitting diode disposed on the substrate and including a pixel electrode, an organic light emitting layer, and a common electrode; a scan interconnection disposed on the substrate and providing a scan signal to the organic light emitting diode; a data interconnection disposed on the substrate and providing a data signal to the organic light emitting diode; and a power interconnection disposed on the substrate and providing a power to the organic light emitting diode. The common electrode has an opening overlapped with at least a portion of the scan interconnection, the data interconnection, and the power interconnection.

The scan interconnection may extend in a first direction and the data interconnection may extend in a second direction crossing the first direction.

The organic light emitting diode may be provided in plural. Each of the organic light emitting diodes may be electrically connected to the scan interconnection, the data interconnection, and the power interconnection.

The common electrode may be provided in one plate-like shape and the plurality of the organic light emitting diodes may share the common electrode.

The organic electro luminescence display may further include: a switching transistor electrically connected to the scan interconnection, the data interconnection, and the power interconnection; and a driving transistor electrically connected to power interconnection and the organic light emitting diode.

BRIEF DESCRIPTION OF THE DRAWINGS

FIGS. 4A to 12A and 4B to 12B are cross sectional views illustrating a method of manufacturing an organic electro luminescence display according to one embodiment.

DETAILED DESCRIPTION

Figure 1:
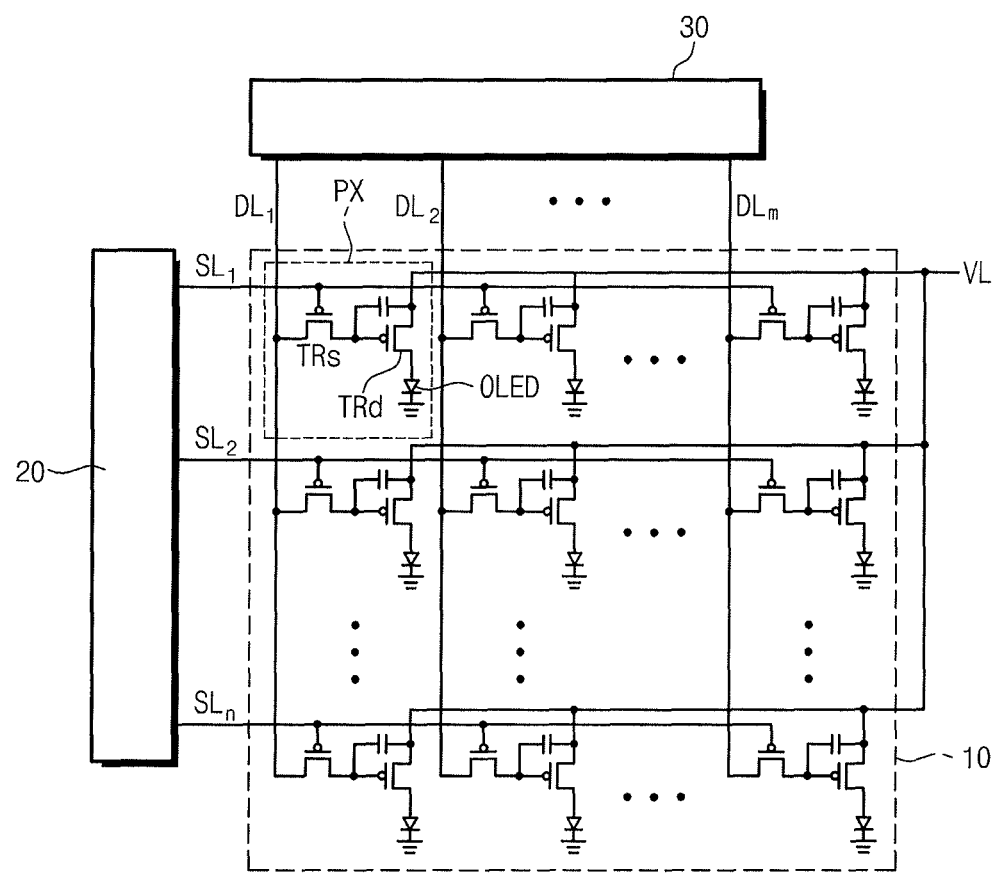
FIG. 1 is a schematic diagram of an organic electro luminescence display according to one embodiment.

Embodiments will now be described more fully hereinafter with reference to the accompanying drawings. The disclosed embodiments are not limited to the specific examples provided in the drawings and are exaggerated for clarity.

FIG. 1 is a schematic diagram of an organic electro luminescence display according to one embodiment.

Referring to FIG. 1, an organic electro luminescence display may include a pixel part 10 displaying an image, a scan driver 20, and a data driver 30.

The scan driver 20 may be electrically connected to the pixel part 10 by a plurality of scan interconnections $SL_1$, $SL_2$, and $SL_n$. The scan driver 20 may transmit scan signals to the pixel part 10 through the scan interconnections $SL_1$, $SL_2$, and $SL_n$. The scan interconnections $SL_1$, $SL_2$, and $SL_n$ may extend in one direction.

The data driver 30 may be electrically connected to the pixel part 10 by a plurality of data interconnections $DL_1$, $DL_2$, and $DL_n$. The data driver 30 may transmit data signals to the pixel part 10 through the data interconnections $DL_1$, $DL_2$, and $DL_n$.

The data interconnections $DL_1$, $DL_2$, and $DL_n$ may extend to cross the scan interconnections $SL_1$, $SL_2$, and $SL_n$. The data interconnections $DL_1$, $DL_2$, and $DL_n$ and the scan interconnections $SL_1$, $SL_2$, and $SL_n$ may cross each other.

The organic electro luminescence display may further power interconnections VL for applying a power to the pixel part 10.

The pixel part 10 may include a plurality of pixels PX. Each of the pixels PX may be electrically connected to a corresponding data interconnection of the data interconnections $DL_1$, $DL_2$, and $DL_n$, a corresponding scan interconnection of the scan interconnections $SL_1$, $SL_2$, and $SL_n$, and a corresponding power interconnection of the power connections VL. The pixel PX may include a switching transistor TRs, a driving transistor TRd, and an organic light emitting diode OLED.

A method of driving the organic electro luminescence display will be described briefly. The scan signal from the scan driver 20 and the data signal from the data driver 30 are transmitted to the pixel PX through the scan interconnection $SL_1$, $SL_2$, or $SL_n$, and the data interconnection $DL_1$, $DL_2$, or $DL_n$, respectively. The switching transistor TRs of the pixel PX receiving the scan signal and the data signal may turn the driving transistor TRd on/off. The driving transistor TRd applies a driving current according to the data signal to the organic light emitting diode OLED. The organic light emitting diode OLED receiving the driving current may emit light having a color corresponding to the driving current. The pixel part 10 may further a capacitor C. The capacitor C may store a voltage corresponding to the data signal.

Even though not shown in more detail in the drawings, the organic electro luminescence display may further include a plurality of additional thin film transistors and a plurality of additional capacitors for compensating a threshold voltage of the driving transistor TRd.

Figure 2A:
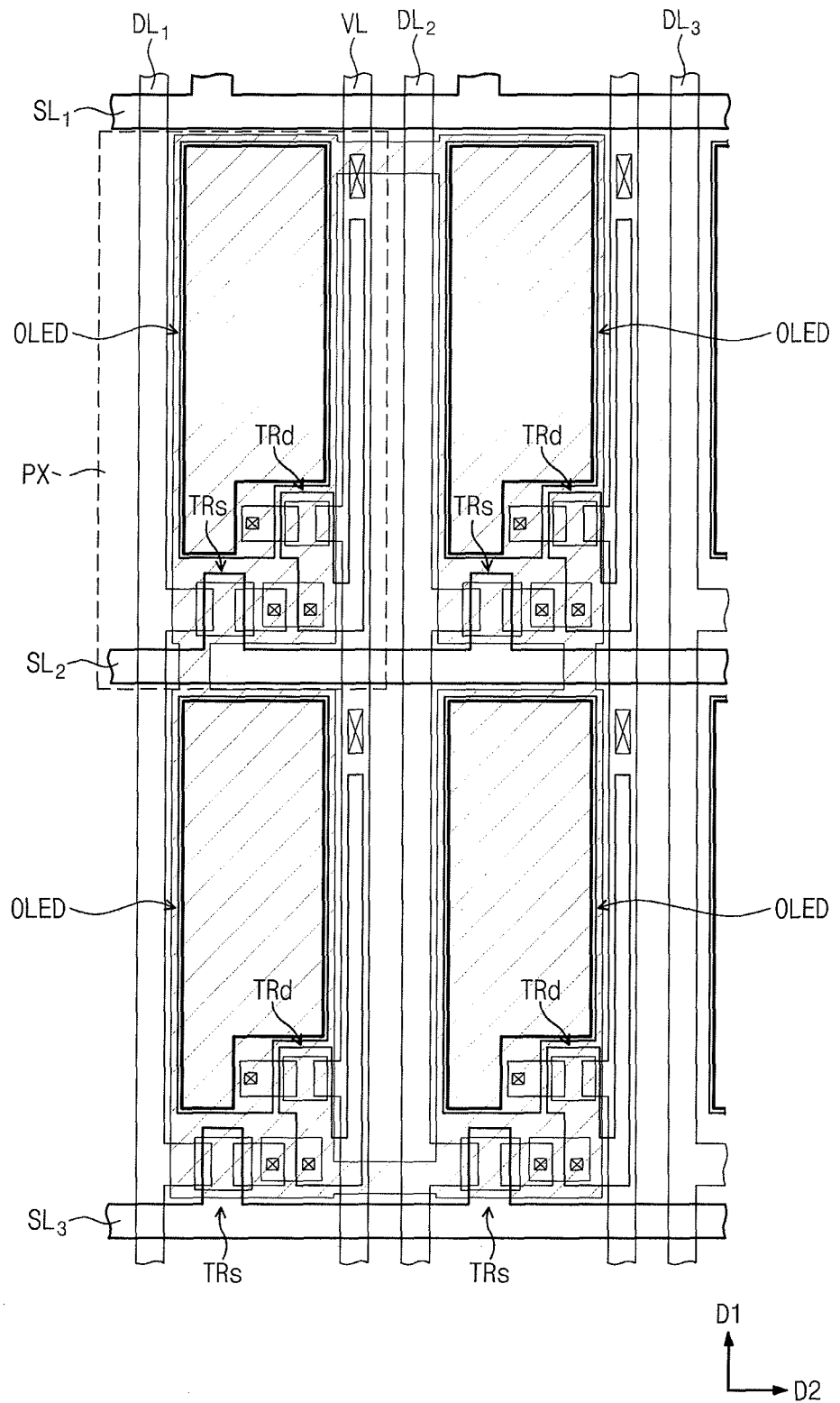
FIGS. 2A and 2B are plan views illustrating an organic electro luminescence display according to one embodiment.
Figure 2B:
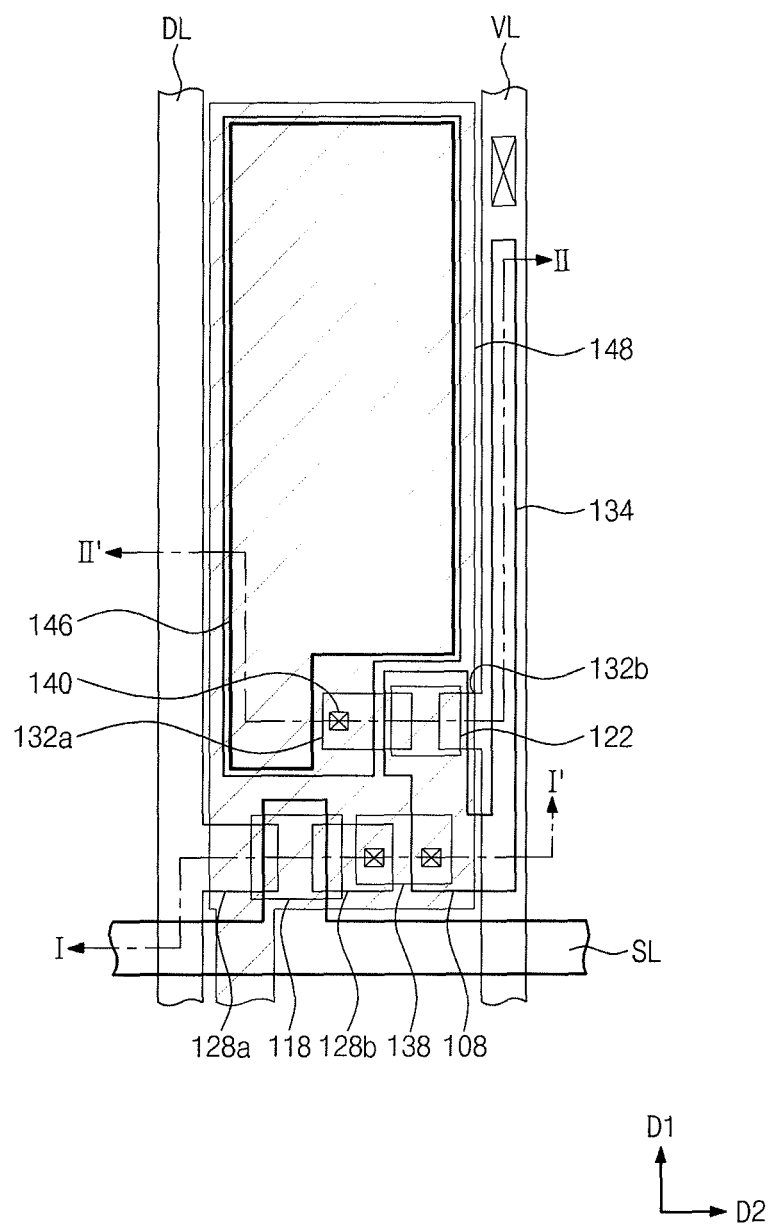
Figure 3A:
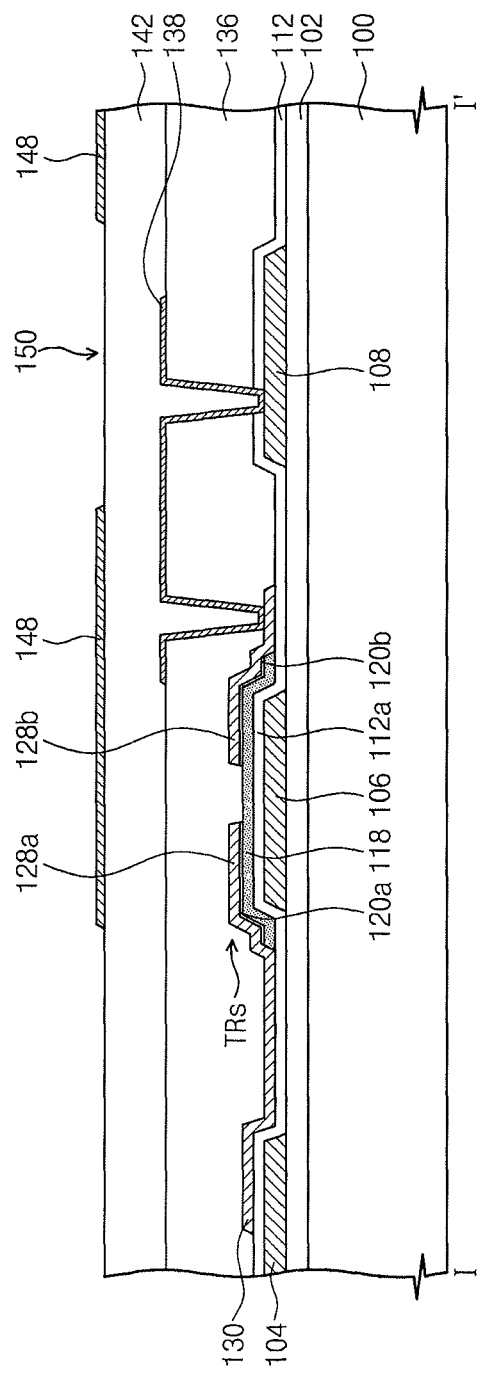
FIGS. 3A and 3B are cross-sectional views illustrating an organic electro luminescence display according to one embodiment.
Figure 3B:
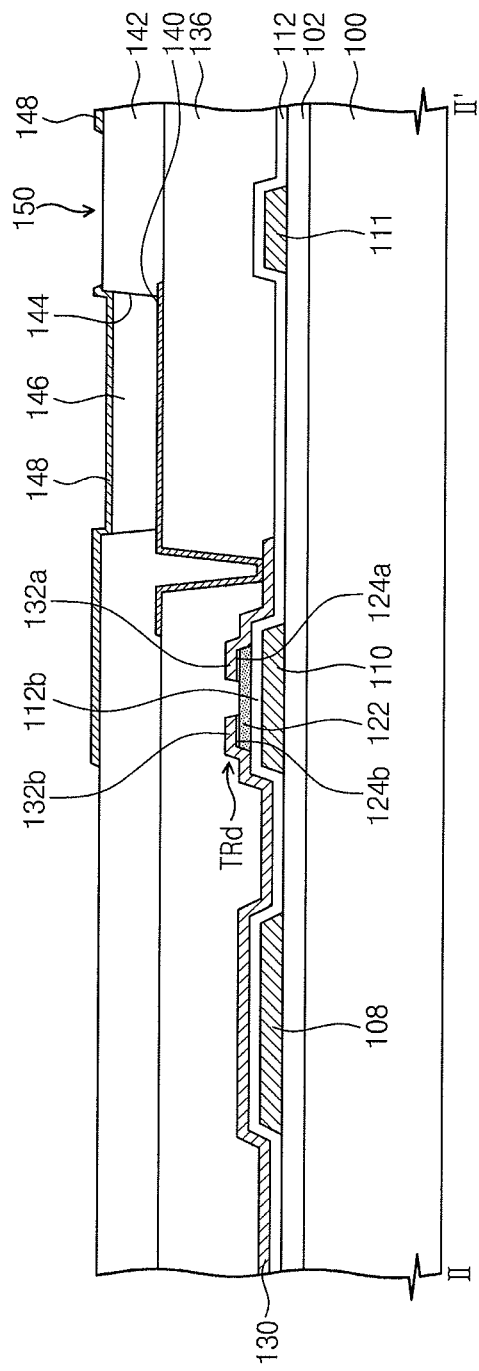

FIG. 2A is a plan view illustrating an organic electro luminescence display according to one embodiment, and FIG. 2B is an enlarged view illustrating a portion of the organic electro luminescence display of FIG. 2A. FIG. 3A is a cross-sectional view taken along a line I-I' of FIG. 2B, and FIG. 3B is a cross-sectional view taken along a line II-II' of FIG. 2B.

Referring to FIGS. 2A, 2B, 3A, and 3B, the organic luminescence display may include the scan interconnections $SL_1$, $SL_2$, and $SL_n$, the data interconnections $DL_1$, $DL_2$, and $DL_n$, the power interconnections VL, and pixels PX disposed on a substrate 100.

The data interconnections $DL_1$, $DL_2$, and $DL_n$ may be arranged by substantially equal intervals to extend in a first direction D1. The scan interconnections $SL_1$, $SL_2$, and $SL_n$ may be arranged by substantially equal intervals to extend in a second direction D2 substantially perpendicular to the first direction D1.

In some embodiments, the power interconnections VL may be arranged by substantially equal intervals to extend in the first direction D1. That is, the power interconnections VL may be substantially parallel to the data interconnections $DL_1$, $DL_2$, and $DL_n$. In other embodiments, the power interconnections VL may be arranged by substantially equal intervals to extend in the second direction D2. That is, the power interconnections VL may be substantially parallel to the scan interconnections $SL_1$, $SL_2$, and $SL_n$. However, the above extending directions of the scan interconnections $SL_1$, $SL_2$, and $SL_n$, the data interconnections $DL_1$, $DL_2$, and $DL_n$, and the power interconnections VL are merely illustrative and are not intended to be limiting.

The scan interconnections $SL_1$, $SL_2$, and $SL_n$, the data interconnections $DL_1$, $DL_2$, and $DL_n$, and the power interconnections VL may cross each other on the substrate 100.

Each of the pixels PX may include the switching transistor TRs, the driving transistor TRd, a capacitor (not shown), and the organic light emitting diode OLED.

The switching transistor TRs may be a thin film transistor. In some embodiments, the switching transistor TRs may include a first gate electrode 106, a first semiconductor pattern 118 spaced apart from the gate electrode 106, a first gate insulating layer 112a disposed between the first gate electrode 106 and the first semiconductor pattern 118, a first source/drain electrode 128a, and a second source/drain electrode 128b. The first source/drain electrode 128a and the second source/drain electrode 128b may overlap with at least portions of the first semiconductor pattern 118, respectively. The first gate electrode 106 may be electrically connected to the scan interconnection SL, the first source/drain electrode 128a may be electrically connected to the data interconnection DL, and the second source/drain electrode 128b may be electrically connected to the power interconnection VL.

The driving transistor TRd may be a thin film transistor. In some embodiments, the driving transistor TRd may include a second gate electrode 110, a second semiconductor pattern 122 spaced apart from the second gate electrode 110, a second gate insulating layer 112b disposed between the second gate electrode 110 and the second semiconductor pattern 122, a first source/drain electrode 132a, and a second source/drain electrode 132b. The first source/drain electrode 132a and the second source/drain electrode 132b of the driving transistor TRd may overlap with at least portions of the second semiconductor pattern 122, respectively. The second gate electrode 110 may be electrically connected to the power interconnection VL. Also, the second gate electrode 110 may be electrically connected to the second source/drain electrode 128b of the switching transistor TRs. The first source/drain electrode 132a may be electrically connected to the organic light emitting diode OLED. The second source/drain electrode 132b may be electrically connected to the power interconnection VL.

The organic light emitting diode OLED may include a pixel electrode 140, a common electrode 148 facing the pixel electrode 140, and an organic light emitting layer 146 disposed between the pixel electrode 140 and the common electrode 148.

The pixel electrode 140 may be formed of indium tin oxide (ITO) or indium zinc oxide (IZO) with excellent light transmittance. The pixel electrode 140 may function as an anode supplying holes into the organic light emitting layer 146.

The common electrode 148 may be formed of ITO or IZO with excellent light transmittance. The common electrode 148 may function as a cathode supplying electrons into the organic light emitting layer 146. The common electrode 148 will be described in more detail later.

The organic light emitting layer 146 may be an organic electro luminescence layer. The organic light emitting layer 146 may be formed of at least one layer generating light. Even though not shown in more detail in drawings, in some embodiments, the organic light emitting layer 146 may include a hole-transport layer, a light emitting layer, an electron-transport layer, and an insulating layer. The light emitting layer may include a plurality of light emitting layers such as a blue light emitting layer, a green light emitting layer, and a red light emitting layer.

Hereinafter, the common electrode 148 will be described in more detail.

The common electrode 148 may have a substantially planar shape which substantially covers the substrate 100. The common electrode 148 may include an opening 150. In more detail, a plurality of organic light emitting diodes may includes a plurality of the pixel electrodes 140, a plurality of the organic light emitting layers 146, and one common electrode 148.

The opening 150 of the common electrode 148 may overlap with at least a portion of the scan interconnection SL, the data interconnection DL, and the power interconnection VL. The opening 150 may be provided in plural. The number of the openings 150 and the shape of the opening 150 are merely illustrative and are not intended to be limiting.

In other embodiments, a conductive layer thinner than the common electrode 148 may remain in the opening 150. In still other embodiments, conductive particles may remain in the opening 150.

Since the area of the common electrode 148 corresponding to the scan, data, power interconnections SL, DL, and VL is minimized, it is possible to minimize a parasitic capacitance between the common electrode 148 and the scan, data, and/or power interconnection SL, DL, and/or VL. Since the parasitic capacitance is minimized, a driving speed of the organic electro luminescence display may be improved and/or a power consumption of the organic electro luminescence display may be reduced.

FIGS. 4A to 12A and 4B to 12B are cross sectional views illustrating a method of manufacturing an organic electro luminescence display according to one embodiment. FIGS. 4A to 12A are cross sectional views taken along a line I-I' to illustrate a method of manufacturing an organic electro luminescence display according to one embodiment, and FIGS. 4B to 12B are cross sectional views taken along a line II-II' to illustrate a method of manufacturing an organic electro luminescence display according to one embodiment.

Figure 4A:
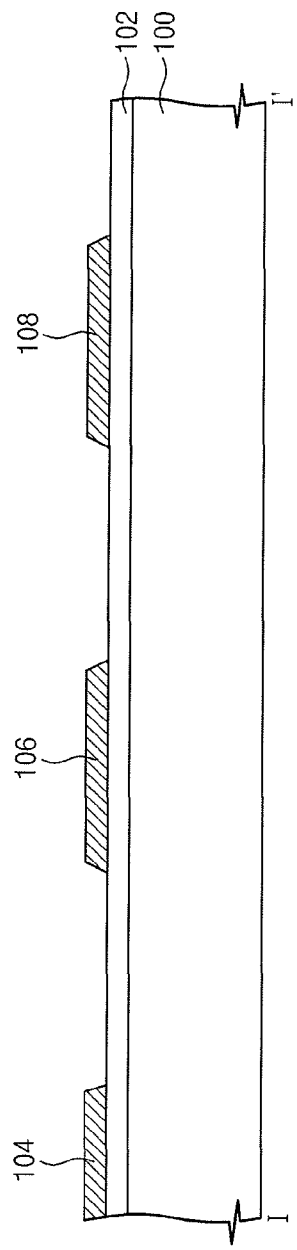
Figure 4B:
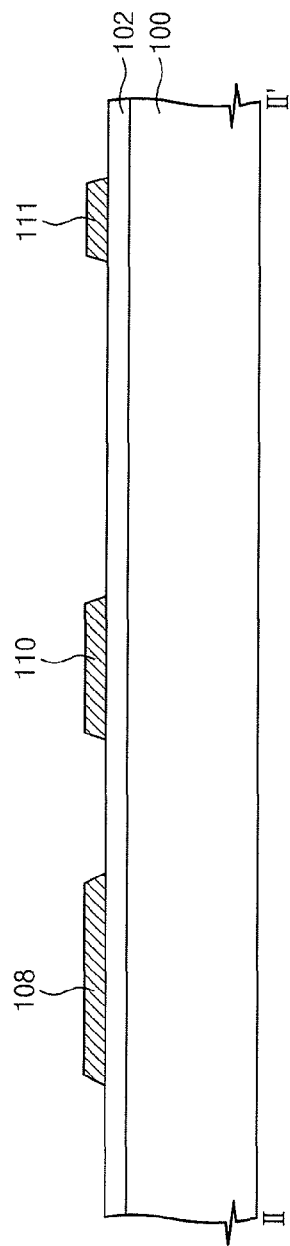

Referring to FIGS. 4A and 4B, a first insulating layer 102 may be formed on a substrate 100. A first conductive pattern 104, a second conductive pattern 106, a third conductive pattern 108, a fourth conductive pattern 110, and a fifth conductive pattern 111 may be formed on the first insulating layer 102.

The first insulating layer 102 may be formed of at least one of silicon oxide, silicon nitride, and silicon oxynitride. A first conductive layer (not show) may be formed on the first insulating layer 102. The first conductive layer may be formed of at least one of aluminum, silver, copper, molybdenum, chrome, tantalum, titanium, and any alloy thereof.

A mask may be formed on the first conductive layer and then an etching process using the mask may be performed on the first conductive layer to form the first to fifth conductive patterns 104, 106, 108, 110, and 111. The first conductive pattern 104 may extend in the second direction D2 of FIG. 2B and function as the scan inter connection SL of FIG. 2B. The second conductive pattern 106 may function as the first gate electrode of the switching transistor TRs of FIG. 2B. The second conductive pattern 106 may be laterally protruded from the first conductive pattern 104 when viewed from a plan view.

The third conductive pattern 108 may be a part extending from the power interconnection VL of FIG. 2B. The fourth conductive pattern 110 may function as the second gate electrode of the driving transistor TRd of FIG. 2B. The fifth conductive pattern 111 may function as the data line DL of FIG. 2B.

Figure 5A:
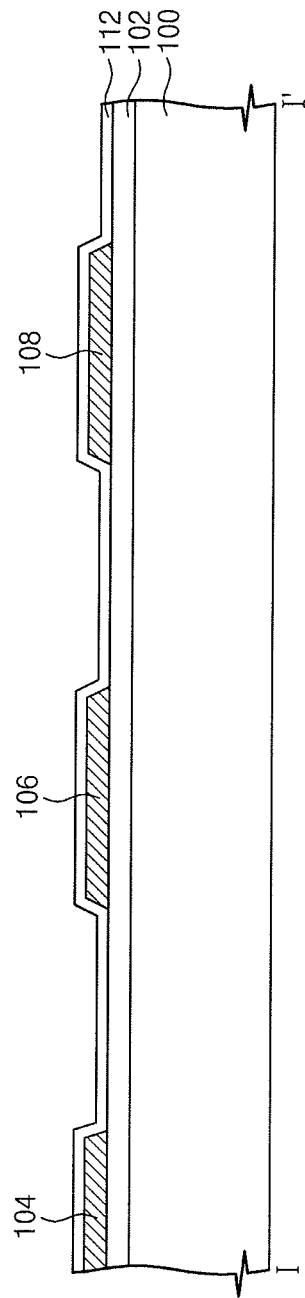
Figure 5B:
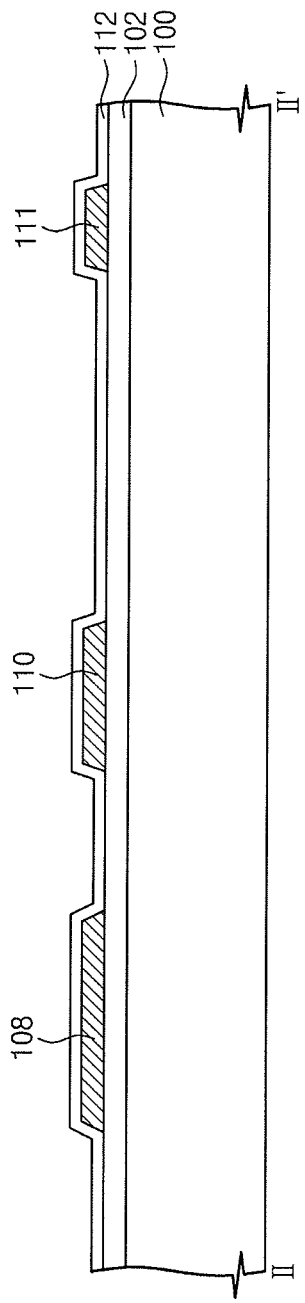

Referring to FIGS. 5A and 5B, a second insulating layer 112 may be formed on the first insulating layer 102 and the first to fifth conductive patterns 104, 106, 108, 110, and 111.

The second insulating layer 112 may function as a gate insulating layer. The second insulating layer may be formed of at least one of silicon oxide and silicon nitride.

Figure 6A:
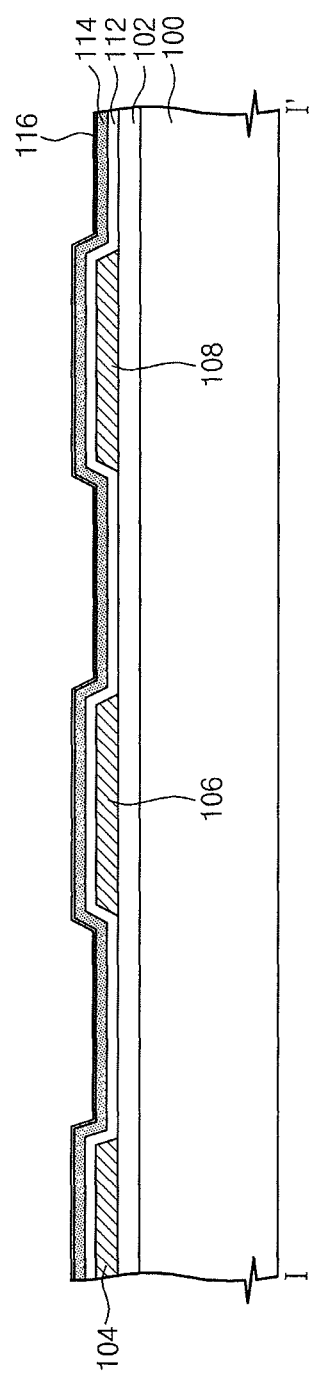
Figure 6B:
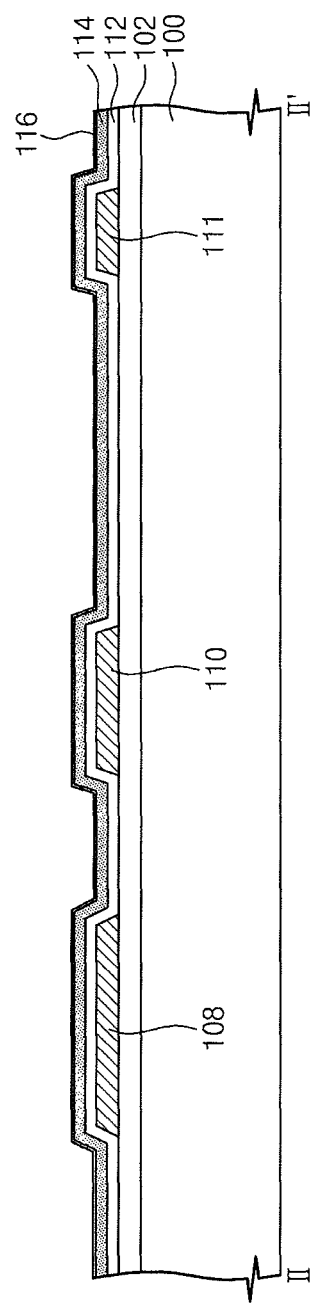

Referring to FIGS. 6A and 6B, a semiconductor layer 114 and an ohmic layer 116 may be sequentially formed on the second insulating layer 112.

The semiconductor layer 114 may be formed of an amorphous semiconductor or a polycrystalline semiconductor. The ohmic layer 116 may be formed of silicide.

Figure 7A:
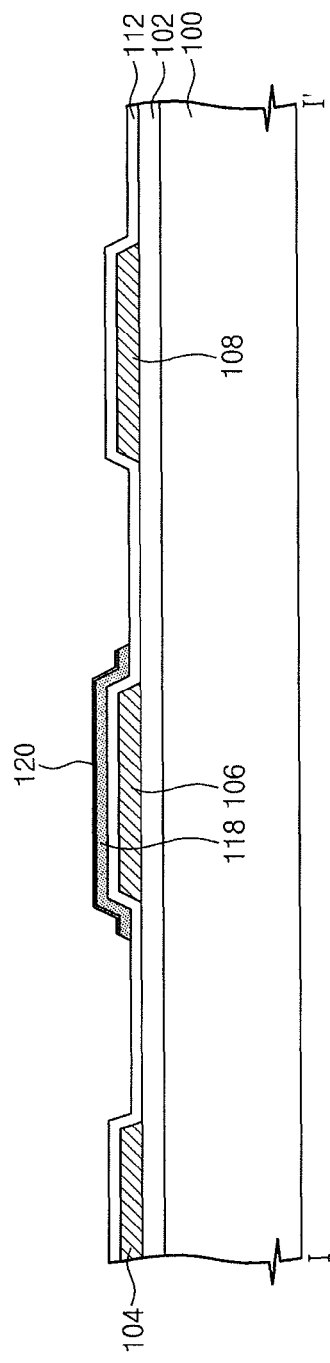
Figure 7B:
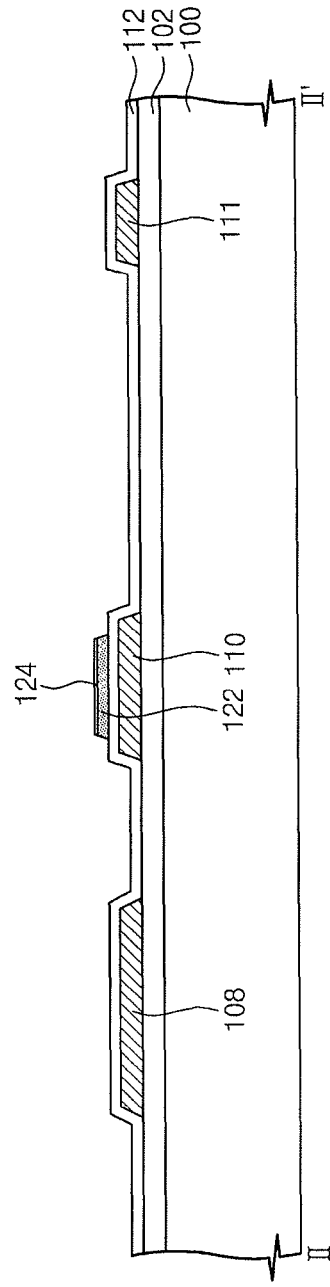

Referring to FIGS. 7A and 7B, the ohmic layer 116 and the semiconductor layer 114 may be etched to form a first semiconductor pattern 118, a second semiconductor pattern 122, a preliminary first ohmic pattern 120 and a preliminary second ohmic pattern 124.

The first semiconductor pattern 118 and the preliminary first ohmic pattern 120 may be formed on the first gate electrode 106. The second insulating layer 112 disposed between the first gate electrode 106 and the first semiconductor pattern 118 is referred to as a first gate insulating layer 112a.

The second semiconductor pattern 122 and the preliminary second ohmic pattern 124 may be formed on the second gate electrode 110. The second insulating layer 112 disposed between the second gate electrode 110 and the second semiconductor pattern 122 is referred to as a second gate insulating layer 112b.

Figure 8A:
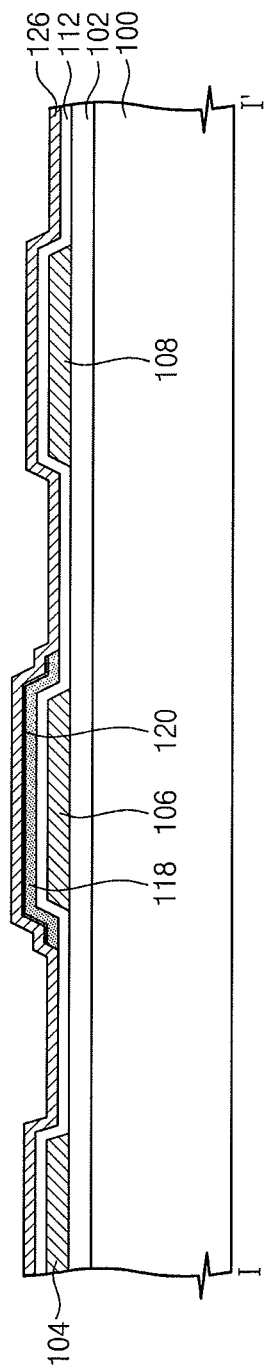
Figure 8B:
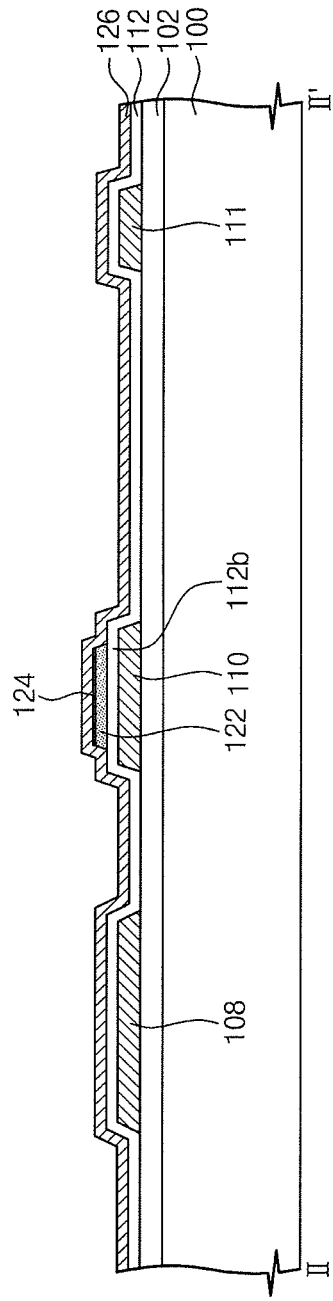

Referring to FIGS. 8A and 8B, a second conductive layer 126 may be formed on the second insulating layer 112, and the first and second preliminary ohmic patterns 120 and 124. The second conductive layer 126 may be formed of metal such as aluminum or aluminum alloy.

Referring to FIGS. 9A and 9B, the second conductive layer 126, the preliminary first and second ohmic patterns 120 and 124 may be etched. The second conductive layer 126 may be etched to form a sixth conductive pattern 130, a seventh conductive pattern 128b, an eighth conductive pattern 134, and a ninth conductive pattern 132a. The preliminary ohmic patterns 120 and 124 may be etched to form first ohmic patterns 120a and 120b and second ohmic patterns 124a and 124b.

The first ohmic patterns 120a and 120b may be formed to expose a center portion of the first semiconductor pattern 118. The second ohmic patterns 124a and 124b may be formed to expose a center portion of the second semiconductor pattern 122.

The sixth conductive pattern 130 may be connected to the data interconnection DL of FIG. 2B extending in the first direction D1 of FIG. 2B. The sixth conductive pattern 130 may extend from the data interconnection DL to cover one 120a of the first ohmic patterns 120a and 120b. The portion of the sixth conductive pattern 130 covering the one 120a of the first ohmic patterns may function as the first source/drain electrode 128a of the switching transistor TRs.

The seventh conductive pattern 128b may be formed to cover another one 120b of the first ohmic patterns. The seventh conductive pattern 128b may function as the second source/drain electrode 128b of the switching transistor TRs.

The eighth conductive pattern 134 may be electrically connected to the power interconnection VL of FIG. 2B. The eighth conductive pattern 134 may extend from the power interconnection VL to cover one 124b of the second ohmic patterns. The portion of the eighth conductive pattern 134 covering the one 124b of the second ohmic patterns may function as the second source/drain electrode 132b of the driving transistor TRd.

The ninth conductive pattern 132a may be formed to cover another one 124a of the second ohmic patterns. The ninth conductive pattern 132a may function as the first source/drain electrode 132a of the driving transistor TRd.

Thus, the switching transistor TRs including the first gate electrode 106, the first gate insulating layer 112a, the first semiconductor pattern 118, the first ohmic patterns 120a and 120b, the first source/drain electrode 128a, and the second source/drain electrode 128b may be formed on the substrate 100.

Additionally, the driving transistor TRd including the second gate electrode 110, the second gate insulating layer 112b, the second semiconductor pattern 122, the second ohmic patterns 124a and 124b, the first source/drain electrode 132a, and the second source/drain electrode 132b may be formed on the substrate 100.

Even though not shown in more detail in drawings, the data interconnection DL connected to the first source/drain electrode 128a of the switching transistor TRs and the scan interconnection SL connected to the first gate electrode 106 may be formed. Also, the power interconnection VL connected to the second source/drain electrode 132b of the driving transistor TRd may be formed.

Figure 10A:
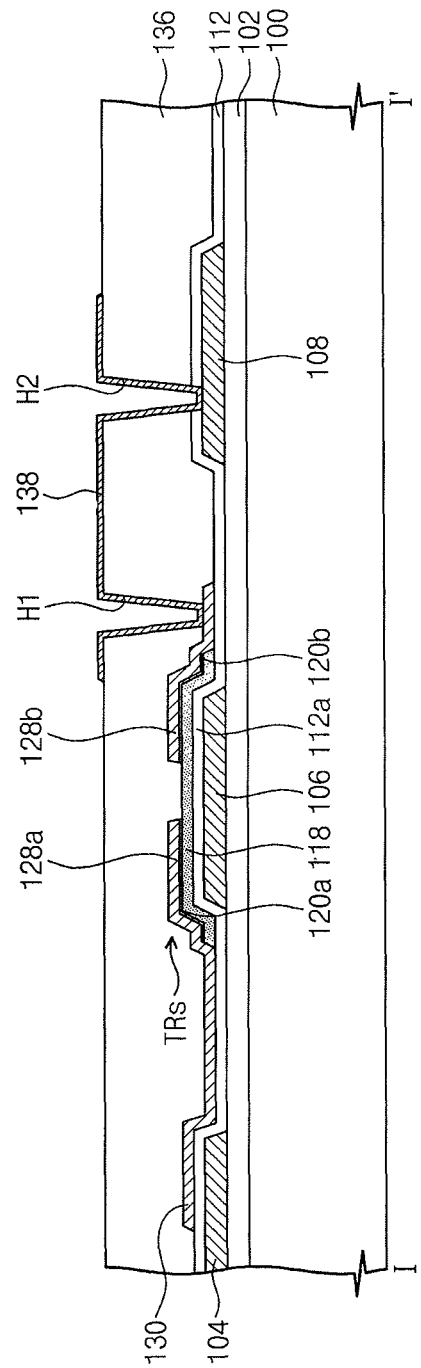
Figure 10B:
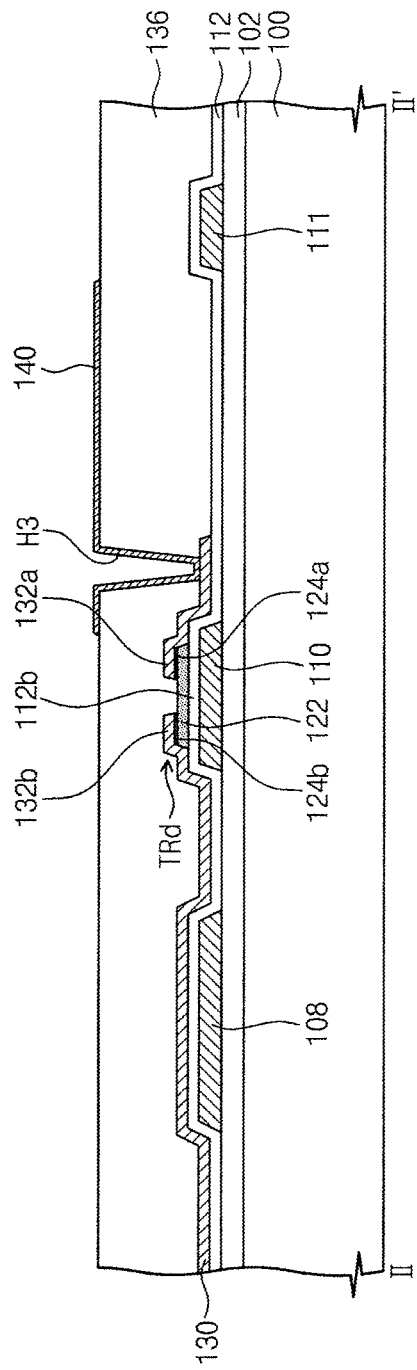

Referring to FIGS. 10A and 10B, a third insulating layer 136 may be formed to cover the substrate 100 on which the switching transistor TRs and the driving transistor TRd are formed. The third insulating layer 136 may have a first contact hole H1, a second contact hole H2, and a third contact hole H3.

The third insulating layer 136 may be formed of silicon oxide, silicon nitride, or silicon oxynitride. The first contact hole H1 may partially expose the second source/drain electrode 128*b* of the switching transistor TRs. The second contact hole H2 may partially expose the third conductive pattern 108. The third contact hole H3 may partially expose the first source/drain region 132*a* of the driving transistor TRd.

Subsequently, a fourth conductive layer (not shown) may be conformally formed on the third insulating layer 136 having the first to third contact holes H1, H2, and H3, and then the fourth conductive layer may be patterned to formed a tenth conductive pattern 138 and a pixel electrode 140.

The tenth conductive pattern 138 extending along inner surfaces of the first and second contact holes H1 and H2 without a cut to electrically connect the second source/drain region 128*b* of the switching transistor TRs to the third conductive pattern 108. The pixel electrode 140 may be electrically connected to the first source/drain electrode 132*a* of the driving transistor TRd.

Figure 11A:
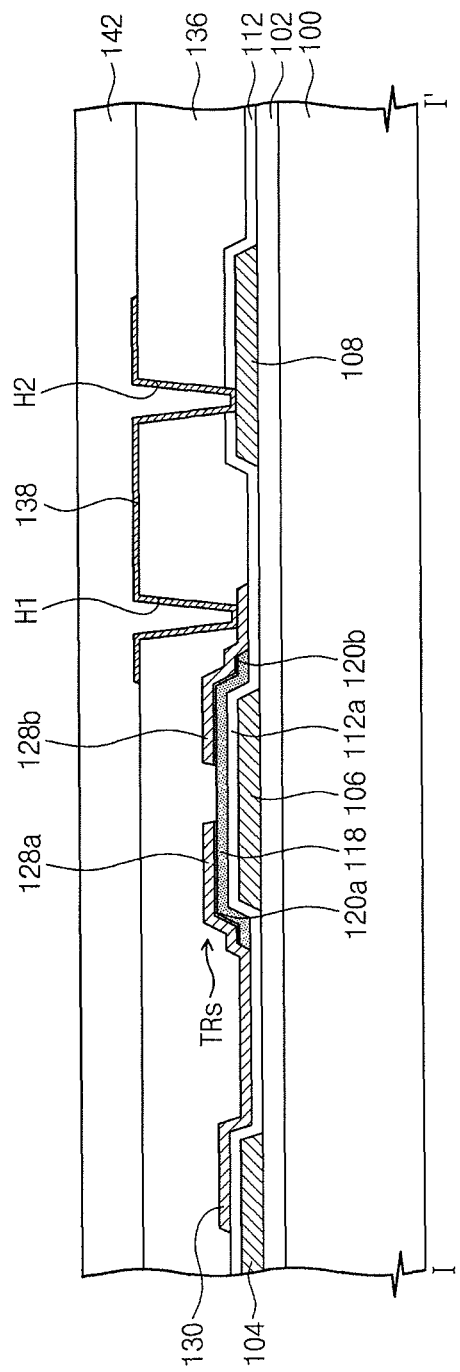
Figure 11B:
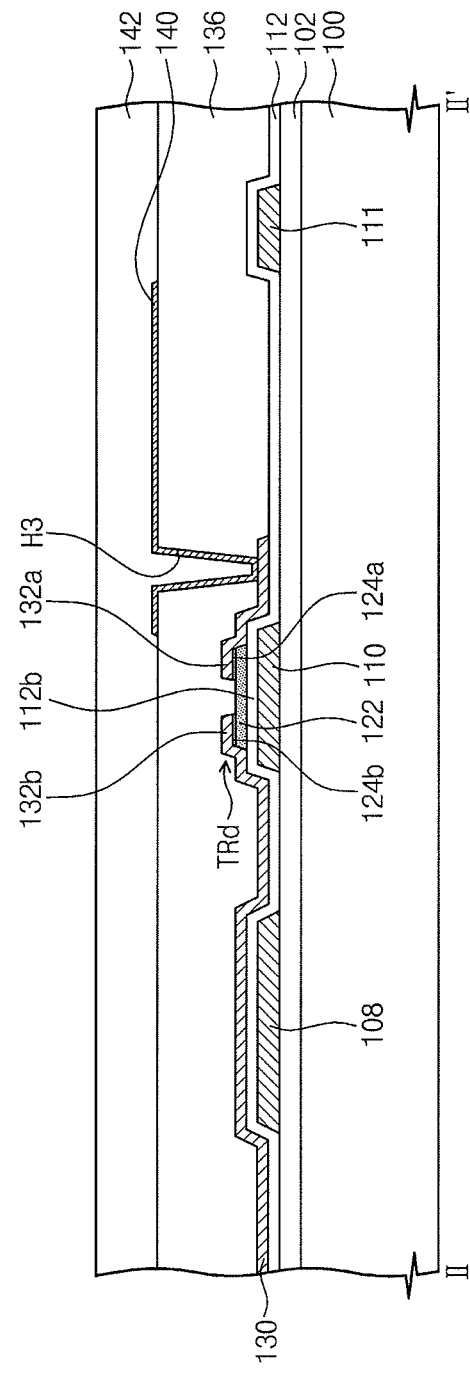

Referring to FIGS. 11A and 11B, a fourth insulating layer 142 may be formed on the substrate 100 on which the third insulating layer 136, the tenth conductive pattern 138 and the pixel electrode 140 are formed. The fourth insulating layer 142 may be formed to substantially completely fill the first to third contact holes H1, H2, and H3 in which the tenth conductive pattern 138 and the pixel electrode 140 are formed.

Figure 12A:
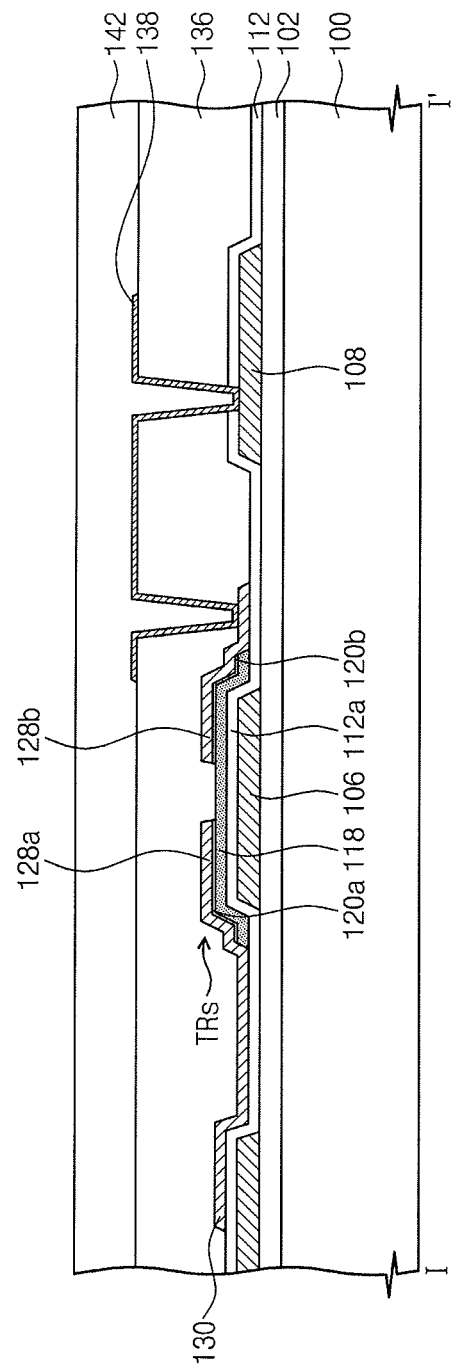
Figure 12B:
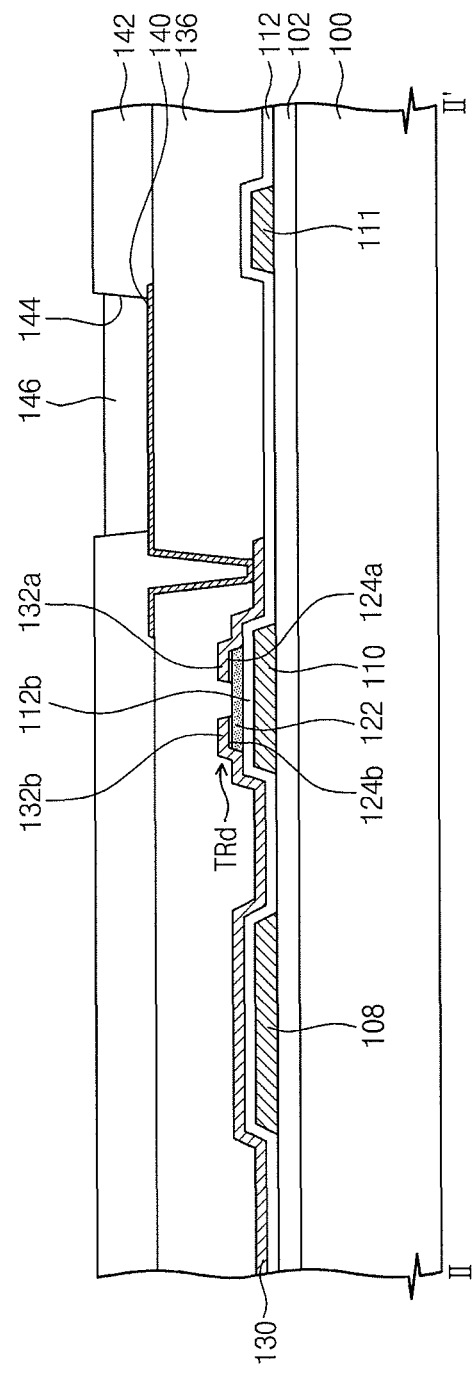

Referring to FIGS. 12A and 12B, an organic light emitting layer 146 may be formed to be in contact with the pixel electrode 140.

The fourth insulating layer 142 may be etched to form a recess 144 partially exposing the pixel electrode 140 and then the organic light emitting layer 146 may be formed to fill the recess 144.

Referring to FIGS. 3A and 3B again, the common electrode 148 may be formed to have the opening 150 corresponding to at least portions of the scan, data, and power interconnections SL, DL, and VL of FIG. 2B.

Even though not shown in more detail in the drawings, after a layer for preventing the formation of the common electrode 148 may be formed on a region corresponding to at least portions of the scan, data, and power interconnections SL, DL, and VL, the common electrode 148 may be formed. The common electrode 148 is not formed on the region corresponding to at least portions of the scan, data, and power interconnections SL, DL by the layer for preventing the formation of the common electrode 148. Alternatively, after a formation-promotion layer may be formed on a region where the common electrode 148 will be formed, the common electrode 148 may be formed on the formation-promotion layer.

In the formation of the common electrode 148 by the process described above, a portion of a conductive layer used as the common electrode 148 may thin remain in the opening 150. Alternatively, conductive particles of the conductive layer used as the common electrode 148 may remain in the opening 150.

Thus, since the area of the common electrode 148 disposed on the scan, data, and power interconnections SL, DL, and VL is reduced, the parasitic capacitance between the common electrode 148 and the interconnections SL, DL, and VL can be reduced.

According to at least one of the disclosed embodiments, since the common electrode has the opening overlapping with at least a portion of the scan, data, and power interconnections, the parasitic capacitance between the common electrode and the scan, data, and power interconnections can be reduced. Thus, an electrical performance of the organic electro luminescence display may be improved.

While the above embodiments have been described with reference to the accompanying drawings, it will be apparent to those skilled in the art that various changes and modifications may be made without departing from the spirit and scope of the following claims. Therefore, it should be understood that the above embodiments are not limiting, but illustrative.

What is claimed is:

1. An organic electro luminescence display comprising:
    a substrate;
    an organic light emitting diode (OLED) disposed over the substrate, wherein the OLED comprises a pixel electrode, a common electrode and an organic light emitting layer interposed between the pixel electrode and the common electrode;
    a scan interconnection disposed over the substrate and configured to provide a scan signal to the OLED;
    a data interconnection disposed over the substrate and configured to provide a data signal to the OLED; and
    a power interconnection disposed over the substrate and configured to provide a power to the OLED,
    wherein an opening defined in the common electrode disposed over the pixel electrode overlaps with a portion of at least one of the scan interconnection and the data interconnection.

2. The organic electro luminescence display of claim 1, wherein the scan interconnection extends in a first direction, and
    wherein the data interconnection extends in a second direction crossing the first direction.

3. The organic electro luminescence display of claim 1, wherein the OLED comprises a plurality of organic light emitting diodes,
    and wherein each of the organic light emitting diodes is electrically connected to the scan interconnection, the data interconnection and the power interconnection.

4. The organic electro luminescence display of claim 3, wherein the common electrode has a substantially planar shape and wherein the organic light emitting diodes share the common electrode.

5. The organic electro luminescence display of claim 1, further comprising:
    a switching transistor electrically connected to the scan interconnection, the data interconnection and the power interconnection; and
    a driving transistor electrically connected to the power interconnection and the OLED.

6. An organic electro luminescence display comprising:
    a substrate;
    an organic light emitting diode (OLED) disposed over the substrate, wherein the OLED comprises a pixel electrode, a common electrode and an organic light emitting layer interposed between the pixel electrode and the common electrode;
    a scan interconnection disposed over the substrate and configured to provide a scan signal to the OLED;
    a data interconnection disposed over the substrate and configured to provide a data signal to the OLED; and
    a power interconnection disposed over the substrate and configured to provide a power to the OLED,
    wherein an opening defined in the common electrode disposed over the pixel electrode overlaps with a portion of the scan interconnection, a portion of the data interconnection and a portion of the power interconnection.

7. An organic electro luminescence display comprising:
a substrate;
an organic light emitting diode (OLED) disposed over the substrate, wherein the OLED comprises a pixel electrode a common electrode and an organic light emitting layer interposed between the pixel electrode and the common electrode;
a scan interconnection disposed over the substrate and configured to provide a scan signal to the OLED;
a data interconnection disposed over the substrate and configured to provide a data signal to the OLED; and
a power interconnection disposed over the substrate and configured to provide a power to the OLED,
wherein an opening defined in the common electrode disposed over the pixel electrode overlaps with a portion of at least one of the scan interconnection, the data interconnection and the power interconnection, and
wherein the opening overlaps with the portion in a direction extending from the substrate to the common electrode.

* * * * *